(12) United States Patent
Moffatt

(10) Patent No.: US 9,209,347 B2
(45) Date of Patent: Dec. 8, 2015

(54) LASER CRYSTALLIZATION AND POLYCRYSTAL EFFICIENCY IMPROVEMENT FOR THIN FILM SOLAR

(71) Applicant: Applied Materials, Inc., Santa Clara, CA (US)

(72) Inventor: Stephen Moffatt, St. Brelade (JE)

(73) Assignee: APPLIED MATERIALS, INC., Santa Clara, CA (US)

( * ) Notice: Subject to any disclaimer, the term of this patent is extended or adjusted under 35 U.S.C. 154(b) by 132 days.

(21) Appl. No.: 13/659,656

(22) Filed: Oct. 24, 2012

(65) Prior Publication Data

US 2013/0109122 A1 May 2, 2013

Related U.S. Application Data

(60) Provisional application No. 61/552,268, filed on Oct. 27, 2011.

(51) Int. Cl.

| | |
|---|---|
| *H01L 21/00* | (2006.01) |
| *H01L 31/18* | (2006.01) |
| *B23K 26/00* | (2014.01) |
| *B23K 26/067* | (2006.01) |
| *B23K 26/073* | (2006.01) |
| *B23K 26/08* | (2014.01) |
| *C30B 1/02* | (2006.01) |
| *C30B 29/06* | (2006.01) |
| *C30B 35/00* | (2006.01) |
| *H01L 21/67* | (2006.01) |
| *H01L 21/677* | (2006.01) |

(52) U.S. Cl.
CPC ........ *H01L 31/1872* (2013.01); *B23K 26/0066* (2013.01); *B23K 26/067* (2013.01); *B23K 26/0732* (2013.01); *B23K 26/0815* (2013.01); *C30B 1/02* (2013.01); *C30B 29/06* (2013.01); *C30B 35/00* (2013.01); *H01L 21/6776* (2013.01); *H01L 21/67115* (2013.01); *Y02E 10/50* (2013.01)

(58) Field of Classification Search
CPC ........................ H01L 21/2026; B23K 26/0639
USPC ........................ 438/57, 31; 250/492.1, 492.2; 219/121.6
See application file for complete search history.

(56) References Cited

U.S. PATENT DOCUMENTS

| | | | |
|---|---|---|---|
| 5,132,505 A * | 7/1992 | Zonneveld et al. ........ | 219/121.6 |
| 2008/0068689 A1* | 3/2008 | Saisho et al. ................. | 359/204 |
| 2008/0176383 A1* | 7/2008 | Tanaka et al. ................. | 438/460 |

* cited by examiner

*Primary Examiner* — Brook Kebede
(74) *Attorney, Agent, or Firm* — Patterson & Sheridan, LLP

(57) ABSTRACT

Apparatus and methods of thermally processing semiconductor substrates are disclosed. Aspects of the apparatus include a source of intense radiation and a rotating energy distributor that distributes the intense radiation to a rectifier. The rectifier directs the radiation toward the substrate. Aspects of the method include using a rotating energy distributor to distribute pulsed energy to a substrate for processing. The rotational rate of the energy distributor is set based on the pulse repetition rate of the energy source. A substrate may be continuously translated with respect to the energy distributor at a rate set based on the pulse repetition rate of the energy source.

14 Claims, 4 Drawing Sheets

LASER CRYSTALLIZATION AND POLYCRYSTAL EFFICIENCY IMPROVEMENT FOR THIN FILM SOLAR

CROSS-REFERENCE TO RELATED APPLICATIONS

This application claims benefit of U.S. provisional patent application Ser. No. 61/552,268, filed Oct. 27, 2011, which is herein incorporated by reference.

FIELD

Embodiments described herein relate to manufacture of photovoltaic devices. More specifically, embodiments described herein relate to apparatus and methods for thermal processing of photovoltaic substrates.

BACKGROUND

Photovoltaic energy generation was the fastest growing energy source in 2007. In 2008, installed photovoltaic capacity increased approximately ⅔ to about 15 GW. By some estimates, the global market for photovoltaic power will grow at a compound annual rate of 32% between 2008 and 2013, reaching over 22 GW, while installed capacity grows at an average rate of 20-30% per year or more, possibly reaching 35 GW by 2013. With available solar resources estimated at 120,000 TW, using less than 0.013% of these available resources could replace fossil fuels and nuclear energy as sources of electrical power. Total global energy consumption of 16 TW in 2005 is less than 0.02% of available solar energy incident on the earth.

With so much potential, countries and companies around the world are racing to increase efficiency, and lower the cost of, photovoltaic power generation. In a typical solar cell, a semiconductor material is exposed to sunlight to mobilize electrons. Some portions of the semiconductor material are doped with electron-rich elements, and other portions are doped with electron-deficient elements to provide a driving force for the mobilized electrons to flow toward current collectors. The electrons flow from the current collectors out to an external circuit to provide electrical power.

The crystal structure of the semiconductor material influences the light absorption characteristics of the cell and the efficiency with which it converts light into electricity. In an amorphous semiconductor material, there are few straight paths for electrons to travel, so electron mobility is less, and the energy required to render the electrons mobile is higher. Amorphous silicon materials, thus, have a larger band gap and absorb light that has a shorter wavelength than light absorbed by a crystalline silicon material. Microcrystalline materials or nanocrystalline materials have some crystal structure, which gives rise to higher electron mobility on average, and lower band gap. Polycrystalline and monocrystalline materials have even higher mobility and lower band gap.

While it is desirable to include absorbers having different morphologies to capture more of the incident spectrum, only small amounts of, for example, amorphous materials are needed to provide the absorbance benefit. Too much amorphous material results in lower efficiency because electrons travel comparatively slowly through the amorphous material, losing energy as they go. As they lose energy, they become vulnerable to Shockley-Read-Hall recombination, falling out of the conduction band back into the valence of an atom, recombining with a "hole", or local electron deficiency, and losing the absorbed solar energy that mobilized them.

To reduce this effect, it is thus desirable to maximize the polycrystalline and monocrystalline morphologies in a solar cell using a thermal treatment. Commonly used processes for treating deposited films and layers scan a line image of laser light across the solar substrate. The line image may be a few centimeters long and a few millimeters wide, so the image must be scanned across the substrate dozens of times to cover the entire area. Such scanning may take up to an hour to process each panel. The comparatively slow production rates require a large financial investment for a given productive capacity, driving up the cost of producing efficient solar cells and panels.

Thus, there is a need for improved apparatus and methods for manufacturing polycrystalline and monocrystalline semiconductor phases efficiently and at high rates.

SUMMARY

Embodiments described herein provide apparatus and methods of thermally processing photovoltaic substrates. Aspects of the apparatus include a source of intense radiation and a rotating energy distributor that distributes the intense radiation to a rectifier. The rectifier directs the radiation towards the substrate.

Aspects of the method include using a rotating energy distributor to distribute pulsed energy to a substrate for processing. The rotational rate of the energy distributor is set based on the pulse repetition rate of the energy source. A substrate may be continuously translated with respect to the energy distributor at a rate set based on the pulse repetition rate of the energy source.

The energy distributor may be reflective, such as a rotating polygonal mirror, or refractive, such as a prism or lens, and may include optics for adjusting the focus, intensity, or uniformity of the energy. The rectifier may also be reflective or refractive, and may also include optics for adjusting focus, intensity, or uniformity of the energy.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments described herein generally provide apparatus and methods for efficient, high volume thermal processing of substrates. Substrates that may be processed using the apparatus and methods described herein include glass and semiconductor substrates.

Figure 1A:
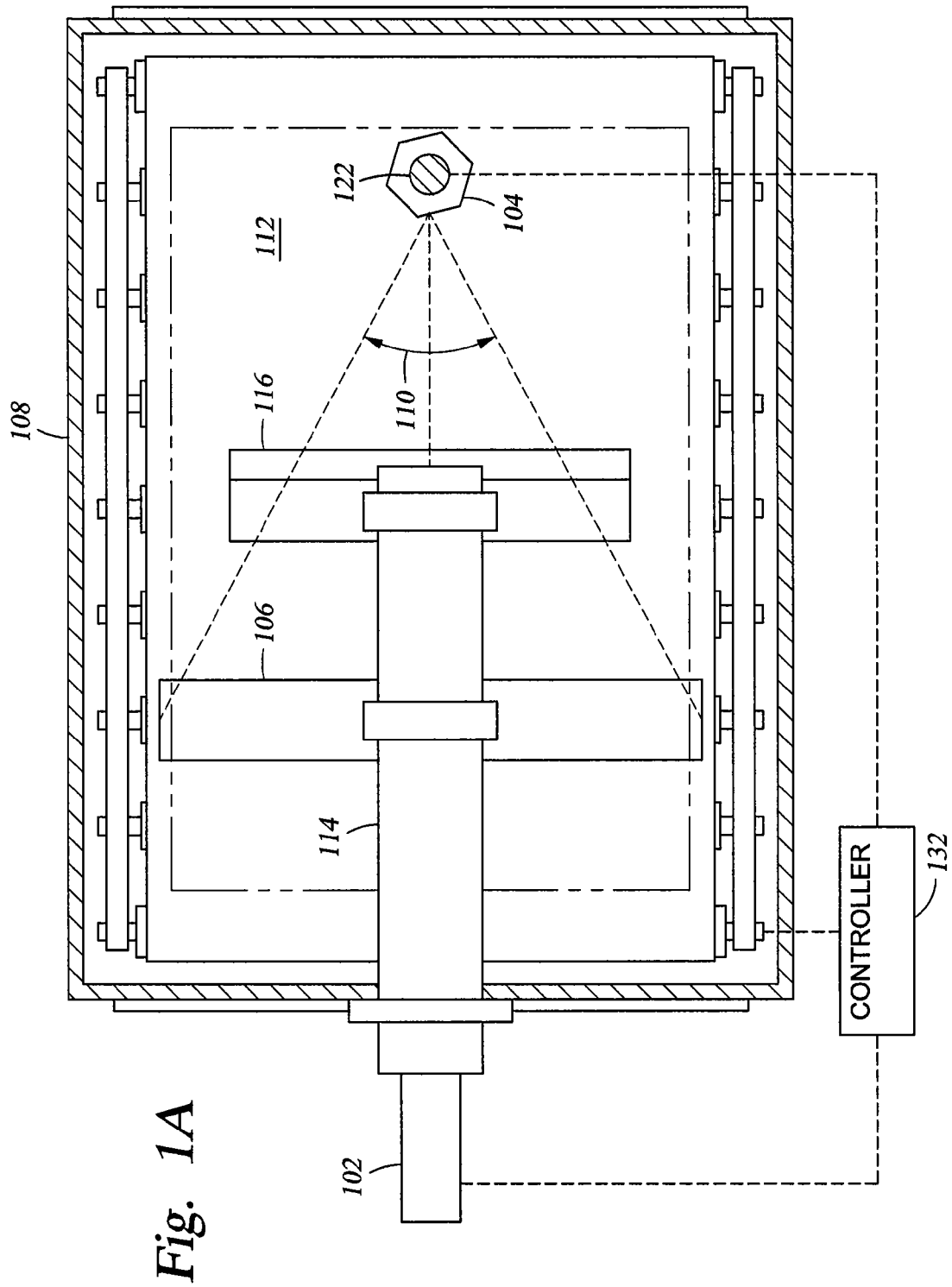
FIG. 1A is a schematic top view of a thermal processing apparatus according to one embodiment.

FIG. 1A is a top view of a thermal processing apparatus 100 according to one embodiment. A radiation source 102 is disposed adjacent to a stage 108 on which a substrate may be positioned for processing. The radiation source 102 directs oriented radiation towards a polygonal mirror 104 that rotates to reflect the intense radiation through a range of angles in an angular reflection field 110 toward a rectifier 106. The rectifier 106 directs the intense radiation from the angular reflection field 110 toward a substrate disposed on the stage 108.

The stage 108 has a work surface 112 that may be movable to position desired areas of the substrate adjacent to the rectifier 106 for processing. In one mode, the movable work surface 112 may be actuated to pass a substrate beneath the rectifier 106.

The radiation source 102 may be a lamp source or a laser source. In one embodiment, a laser source may produce a spatially uniform beam of laser energy having a desired shape, size, and energy density. An example of such a laser source is described in U.S. Patent Publication 2009/0032511, which was published on Feb. 5, 2009, and is herein incorporated by reference.

In another embodiment, a lamp or plurality of lamps, for example a bank of xenon arc lamps, may be disposed in an array oriented to deliver intense radiation to the polygonal mirror 104. For highly divergent radiation sources such as lamp sources or laser diode sources, a waveguide 114 may be provided to direct the radiation toward the polygonal mirror 104. The waveguide 114 may be a conduit with a reflective inner surface for confining radiation to the desired path. Divergence of the radiation is prevented until the radiation is a minimum distance from the polygonal mirror, minimizing loss of power. The waveguide 114 may also be functional to improve uniformity of the power distribution of the radiation field incident on the polygonal mirror 104 through internal reflections. The waveguide may have a rectangular, polygonal, circular, or elliptical cross-section.

The polygonal mirror 104 is a distributor that rotates to direct incident radiation to different locations on the rectifier 106 for processing different target zones of the substrate. A motor typically rotates the polygonal mirror 104. As the polygonal mirror 104 rotates, the radiation reflected from the polygonal mirror 104 moves through the angular reflection field 110. The rectifier 106 directs the radiation to the successive target zones of the substrate resulting in a processing pattern related to rotation of the polygonal mirror 104. The pattern is repeated when the polygonal mirror 104 completes a set rotational program. For example, as a vertex of the polygonal mirror 104 approaches the optical path of the incident radiation, reflection of the radiation approaches an extremity of the angular reflection field 110. When the vertex of the polygonal mirror 104 crosses the optical path of the incident radiation, the reflected radiation reverts to the opposite extremity of the angular reflection field 110 to repeat the pattern. In one mode, a polygonal mirror having N reflective facets may rotate at a rate R that completes N scans per rotation, each scan processing a full width of the substrate. In other modes, the polygonal mirror may rotate at a rate iR that completes N/i scans per rotation. For example, the polygonal mirror may rotate at a rate that exposes one target zone per rotation of the polygonal mirror in some cases.

Generally, the linear projection of reflected radiation from the rotating polygonal mirror 104 diverges from a center according to the tangent of the rotational angle. Unmodified, processing a substrate using such reflected radiation would result in longer processing times for locations near the optical path of the incoming radiation and shorter processing times for locations further from the optical path for constant rotational rates. A deflector 116 may be used to linearize beam movement with respect to rotational angle, if desired. The deflector 116 redirects radiation received from the polygonal mirror 104 along a path that differs from the path of the received radiation such that the radiation received by the rectifier 106 is displaced from the optical path of the original radiation, near the center of the rectifier, by an amount proportional to the rotation of the polygonal mirror 104. By using such a device, each target zone of the substrate is processed for substantially the same amount of time at a constant rate of rotation of the polygonal mirror 104, because the radiation field moves along the rectifier 106 at a constant velocity.

An example of a deflector that may be used for such a modification is an F-Theta lens. An F-Theta lens is a lens shaped to provide a barrel distortion to incident radiation. Barrel distortion is characterized by increasing refraction of light toward the extremities of the lens, so light incident near the edge of the lens is refracted more than light incident near the center of the lens. The particular barrel distortion of the lens is selected to provide a deflection function suited to the particular geometry of a system. Alternatively, a simple prism having a varying refractive index may be used as a deflector. If the refractive index of the prism varies according to a particular function of location within the prism, a similar performance may be realized. Naturally, a combination of shape and material variation may also be used, if desired. The optical features of the deflector 116 may be designed directly into the surface shape of each facet of the polygonal mirror 104, if desired, to eliminate the deflector 116. For example, a precisely designed convexity may be provided in each reflective facet.

The rectifier 106 is an optical element that directs radiation received from the polygonal mirror 104, by way of the deflector 116, toward the substrate. The rectifier 106 may be a single element or a collection of elements, and may include reflective and refractive elements. In one embodiment, the rectifier 106 is a collection of mirrors, each individually angled to reflect radiation from the polygonal mirror 104 in a direction normal to the substrate surface.

The rectifier 106 may include optical features to adjust the focus or energy distribution of the radiation field received from the polygonal mirror 104, if desired. In some embodiments, optical path length is a variable that affects uniformity of energy distribution in the radiation field. As coherency declines with path length, uniformity of energy distribution may drift upward or downward. In such embodiments, each component of the rectifier 106 may include an optical adjustment, such as an astigmatism or birefringence, to correct for differences in optical path length. For example, if the radiation field is divergent, the energy distribution of radiation received at the substrate surface may differ from target zone to subsequent target zone. Corrective optical features may include focusing surfaces, defocusing surfaces, and/or distorting surfaces. If an F-Theta lens is used, the corrective optical features may include specific reflective or refractive patterns for reversing the radiation field non-uniformity introduced by the barrel distortion of the F-Theta lens.

Figure 1B:
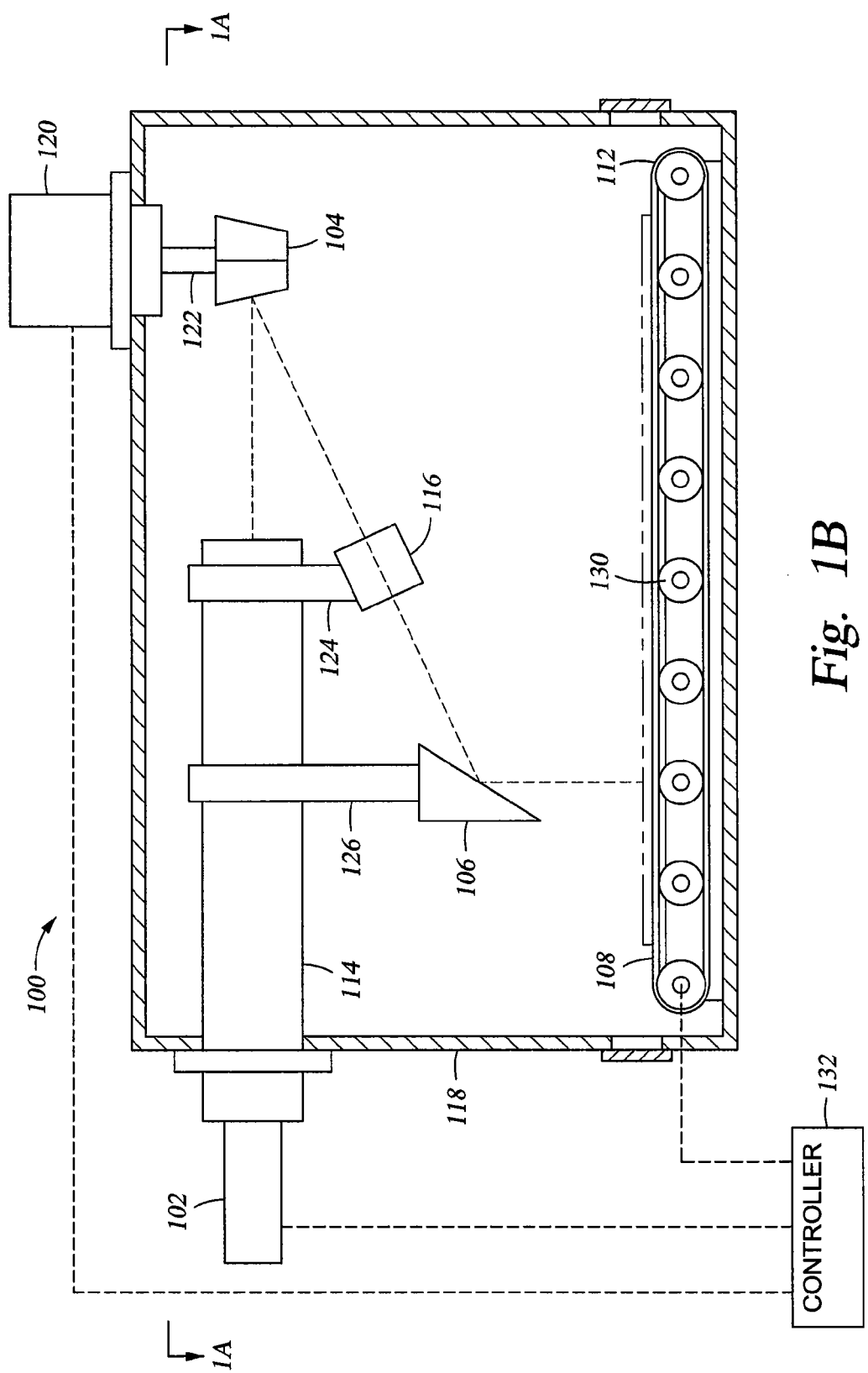
FIG. 1B is a schematic side view of the thermal processing apparatus of FIG. 1A.

FIG. 1B is a schematic side view of the apparatus 100 of FIG. 1A. An enclosure 118, not visible in the top view of FIG. 1A, is shown supporting various components of the apparatus 100. The enclosure 118 also provides confinement of the radiation produced by the apparatus 100. The polygonal mirror 104 is connected to a rotational motor 120 by a shaft 122, shown penetrating the enclosure 118 to allow operation of the motor 120 outside the enclosure 118. The deflector 116, rectifier 106, and the optional wave guide 114 are all supported from a wall of the enclosure 118 by supports 124, 126, and 128, respectively. The supports 124, 126, and 128 appear as shaft or rod like members in FIG. 1B, but any form of support that does not block the optical path may be used.

The movable substrate support 108 is shown in FIG. 1B as a conveyor, schematically actuated by rollers 130. Other translation mechanisms, such as a rolling tray, may also be used. The substrate support 108 may be operable to transport a substrate through the apparatus 100 continuously or in steps, starting and stopping as needed for processing intervals. In a stepwise embodiment, the substrate is stationed relative to the rectifier 106 for a processing interval, and then moved to a subsequent position for a subsequent processing interval. In a continuous embodiment, the substrate continuously moves through the apparatus 100, and the rotation rate of the polygonal mirror 104 and the emitting characteristics of the radiation source are tuned to match the translation rate of the substrate.

In an embodiment wherein the radiation source 102 is a pulsed laser source, the pulse rate of the pulsed laser source and the rotation rate of the polygonal mirror 104 are synchronized such that every time the pulsed laser source emits a pulse of radiation, a facet of the polygonal mirror 104 is positioned to reflect the pulse to a selected point on the rectifier. The rotation rate of the polygonal mirror 104 is selected to direct successive pulses of the laser source to successive points on the rectifier, and to successive target processing zones along a row of the substrate. For delivering one pulse per target zone as the polygonal mirror 104 rotates through a single-row exposure, the rotation rate is approximately $$R_1 = \frac{w_p}{W}\arctan\left[\frac{W^2}{4\tan\left(\frac{\pi}{f}\right)}\right]$$

where w is the width of a single exposure field, p is the pulse rate of the laser source, W is the total width of the substrate, and f is the number of facets on the polygonal mirror. $R_1$ is expressed in radians, and it should be noted that adding integer multiples of $2\pi$ to the rotation rate $R_1$ achieves a similar result.

A controller 132 controls the rotation rate of the polygonal mirror 104 by controlling the motor 102. The controller 132 also controls the pulsing of the radiation source 102 and the translation of the substrate on the movable substrate support 108 to achieve a desired treatment program. For a stepwise substrate translation program, in which the substrate is held substantially stationary during exposure of a row of target zones, moved to position a second row of target zones, and held substantially stationary during exposure of the second row of target zones, the adjacent exposed zones may be laterally aligned (i.e., the boundaries of each target zone facing in the direction of translation are aligned with the same boundaries of the other target zones in the row). For a continuous translation program, the adjacent exposed zones may be displaced relative to each other by a distance related to the interval between exposure of the adjacent exposed zones. For the case above in which each successive pulse irradiates a successive zone, the displacement of adjacent zones will be Z/p, where Z is the translation speed of the substrate. For best results, in such an embodiment, the translation of the substrate during exposure of an entire row may be equated to the length l of a single exposure field in the translation direction, with any desired spacing included in the length l. Thus, upon completing a row of target zones, the substrate is positioned such that the first target zone of the new row is precisely aligned with the first target zone of the preceding row according to a desired spacing. In such an embodiment, the translation speed of the substrate will be approximately Z=wlp/W.

The processing time of a full substrate, delivering one pulse per treatment area is the ratio of the full area to a treatment zone area divided by the pulse rate of the laser source. Using a laser source with a high pulse rate will speed throughput of substrates. For example, a substrate having an area of 60,000 $cm^2$, processed in 10 $cm^2$ increments, has 6,000 processing zones. Delivering a single energy pulse to each zone using a kilohertz pulse rate would allow such a large substrate to be processed in seconds. It should be noted that, if a single treatment zone is to be irradiated with multiple pulses, some embodiments may require stepwise translation of the substrate to achieve sufficient treatment precision.

A substrate may be processed according to a slow translation program, in which translation of the substrate is slow relative to the pulse rate of the radiation source. In such an embodiment, pulsing of the radiation source may be paused briefly at the end of a processing row to allow the substrate to translate to the next processing row. Having a fast pulsing radiation source coupled with a relatively slow translation may reduce incremental spacing of neighboring target zones in a row. High throughput is still attainable using a high pulse rate radiation source. For example, a solar substrate having a processable area of dimension 2.4 m×2.4 m may be processed in 9 $cm^2$ increments by processing one row of 80 target zones per second. If the entire row is processed in 0.1 seconds, using a radiation source that pulses 800 times per second, with a 0.9 second translation pause every 80 pulses, and with a polygonal mirror that rotates at a commensurate rate, displacement of the target zones at either end of the row relative to each other is only 3 mm. Adding a 3 mm exclusion zone to each end of the substrate provides a means for processing a large substrate in approximately 4 minutes. Doubling the pulse rate and the translation rate cuts that processing time in half. A laser or other radiation source that can be pulsed at a rate between about 1 kHz and about 100 kHz is generally useful for practicing the embodiments described herein, and variants thereof.

The foregoing discussion generally applies to processing of planar substrates, but a thermal processing system having a rotating energy distributor is also suited to processing curved substrates. For example, the non-linearity described above with respect to directing a beam from a rotating polygonal mirror may be eliminated by positioning a curved substrate around the rotating polygonal mirror, provided the axis of curvature is the same as the axis of rotation.

The rotating polygonal mirror described above is an example of a reflective energy distributor. Rotating refractors may also be used in some embodiments. A rotating refractor may have the advantage that linearizing shape may be designed into the surface of the rotating refractor so that as the refractor rotates, the energy emitted by the rotating refractor progresses along the rectifier in a linear relationship to the angle of rotation.

Figure 2:
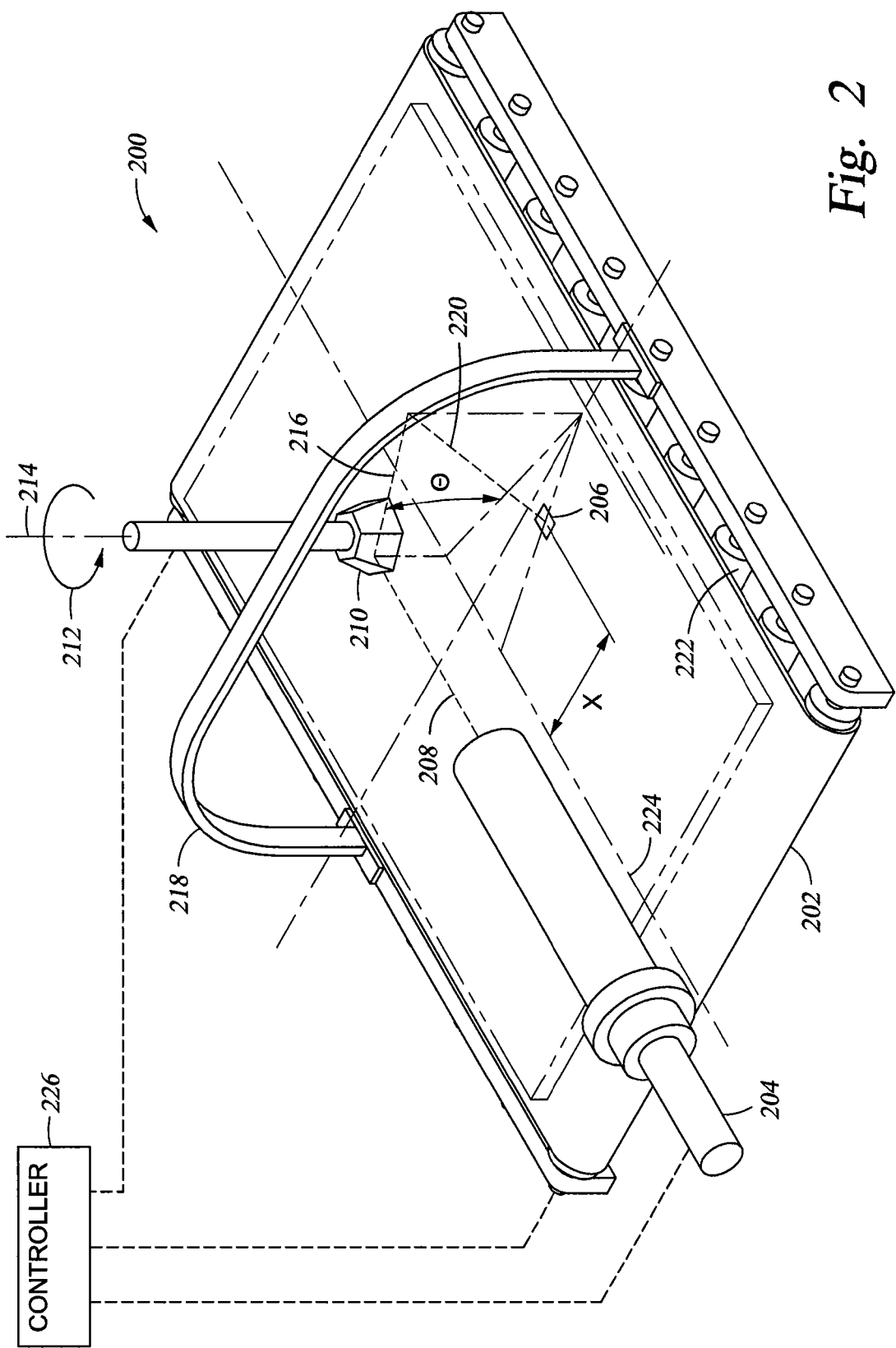
FIG. 2 is a perspective view of a thermal processing apparatus according to another embodiment.

FIG. 2 is a perspective view of a thermal processing apparatus 200 according to another embodiment. A work surface 202, which may be movable as indicated schematically by rollers 222, provides a work space for positioning a substrate. An energy source 204, such as a laser, produces a directed energy stream 208 of radiant energy along a path substantially parallel to the plane defined by the work surface 202, and toward an energy distributor 210. The energy distributor 210 may be a reflector or a refractor, and rotates as indicated by arrow 212 to deflect the directed energy stream 208 toward a collector 218, which is an optical element, or collection thereof, that collects the energy of the directed energy stream 208 and directs the collected energy towards the substrate. The energy distributor 210 generally has a motor that rotates the energy distributor at a desired rate. The energy distributor 210 is supported at a desired location above the work surface 202 by a support 214.

The energy distributor 210 sends a reflected stream 216 of directed energy toward the collector 218, which sends the reflected stream 216 toward the work surface 202 in a normal stream 220, which is a stream of directed energy normal to the work surface 202. The collector 218 has a reflective surface that faces the work surface 202. The reflective surface has a shape that reflects the directed energy such that a distance "x" of the exposed area 206 of the work surface 202 from a center line 224 of the work surface 202 is substantially proportional to an angular elevation θ of the reflected energy stream 216 above the plane defined by the work surface 202. The collector 218 may have a plurality of flat mirrors, a continuous faceted mirrored surface, or a continuous curved mirror surface.

As described above in connection with the apparatus 100 of FIGS. 1A and 1B, a substrate may be continuously translated through the apparatus 200 under the collector 218 while pulses of energy are directed to the substrate by way of the rotating energy distributor 210. The substrate may also be translated stepwise through the apparatus. Optics may also be included, if desired, to confine divergent light as it approaches the energy distributor, and the energy distributor may have focusing optics, such as curved reflective or refractive surfaces, to compensate for differential divergence or loss of coherence due to different path length, if desired. A controller 226 controls the rotation of the energy distributor 210, the pulse rate of the energy source 204 and the translation of the substrate to achieve a desired treatment program. The rotation of the energy distributor 210, the pulse rate of the energy source 204, and the translation of the substrate may be synchronized by the controller 226 to match an edge of one treatment zone 206 of the substrate to an edge of an adjacent treatment zone to achieve uniform treatment of the substrate by piecing together rectangular treatment zones, particularly if the rectangular energy field applied to each treatment zone is uniform.

In alternate embodiments, a high repetition rate radiation source may be coupled with two movable mirrors to position a radiation field for processing different target zones of a substrate. The movable mirrors may be scanned through a pattern as the radiation source is pulsed such that the target zones are processed according to any desired pattern, with the rate of movement of the mirrors related to the repetition rate of the radiation source. Description of some ways to treat substrates using two movable mirrors may be found in U.S. Patent Publication 2011/0239421, published on Oct. 6, 2011, which is incorporated herein by reference.

Figure 3:
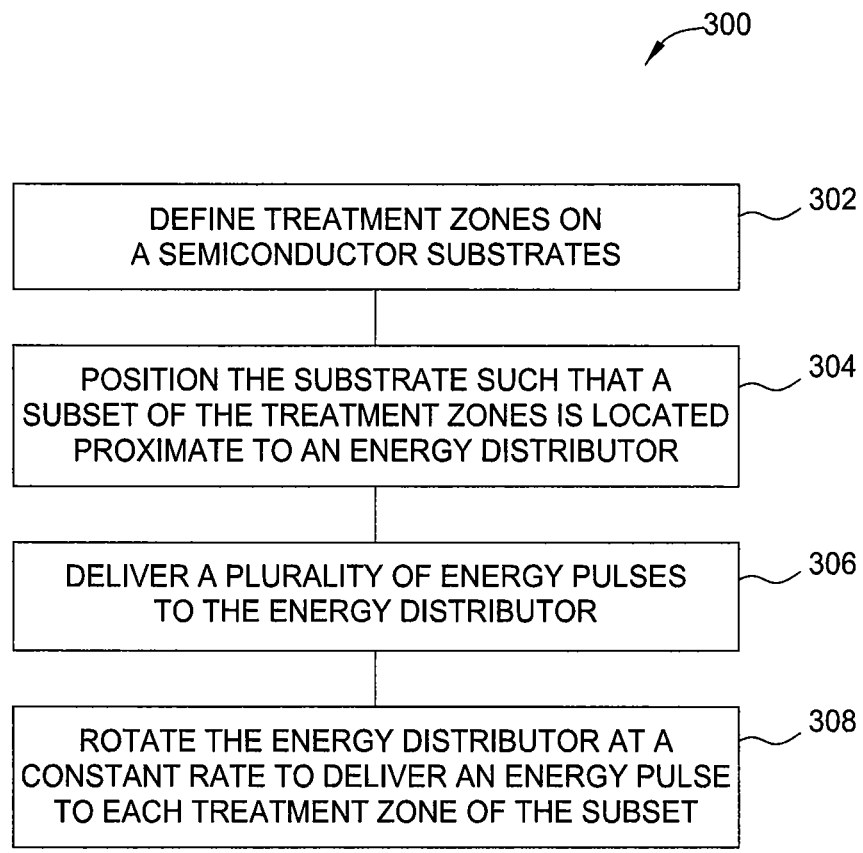
FIG. 3 is a flow diagram summarizing a method according to an embodiment.

FIG. 3 is a flow diagram summarizing a method 300 according to an embodiment. The method 300 may be used in thermal processing of substrates, and may be particularly useful in thermal processing of large substrates such as solar panels. Crystalline solar panels may be formed efficiently by depositing the various layers of the solar panels as amorphous, microcrystalline, or polycrystalline materials and then using the thermal treatment of the method 300 to crystallize, or increase the crystal size of, the solar panel.

At 302, treatment zones are defined on a photovoltaic substrate to be processed. The treatment zones are typically defined in accordance with the size and shape of an energy field to be applied to each treatment zone. The position of each treatment zone is likewise defined to provide substantially precise alignment of the treatment zone boundaries, overlap of portions of the treatment zones, or space between the treatment zones, as desired. As described above in connection with FIG. 2, rectangular treatment zones may be aligned by synchronizing pulse rate, rotation rate of the polygonal mirror, and translation rate of the substrate.

At 304, the substrate is positioned on a work surface such that a subset of the treatment zones is exposed to an energy apparatus. The energy apparatus delivers energy to a work surface, on which the substrate rests, by way of an energy distributor. Positioning the substrate may be accomplished by moving a work stage on which the substrate rests or by directly manipulating the substrate using a carrier or a rolling tray.

At 306 a plurality of energy pulses are delivered to the energy distributor proximate the substrate. The energy pulses may be laser pulses, or pulses of other kinds of electromagnetic energy, such as flash lamp, heat lamp, LED, and/or microwave pulses. The energy pulses are usually delivered with cross-sectional energy density averaging about 0.5 J/cm$^2$, with standard deviation of about 3% or less. Pulse duration depends on power output of the energy sources, but is generally less than 1 msec. The energy pulses may be delivered with constant intervals between the pulses, or with longer intervals defining pulse groups with shorter intervals.

At 308, the energy distributor that receives the plurality of energy pulses is rotated at a constant rate to deliver an energy pulse to each treatment zone of the subset. The energy distributor changes the direction the energy pulses propagate as it rotates, receiving the energy pulses along a constant optical path and redirecting them to an optical path that changes with rotation of the energy distributor. The energy distributor may be reflective or refractive, for example mirrors, prisms, lenses, and the like. The energy distributor may include optical elements that compensate for non-linearity in projecting the rotational aspect of the energy distributor onto the planar surface of the substrate, if a planar substrate is used. It should be noted that using a curved substrate having an axis of curvature that is the same as the axis of rotation of the energy distributor would also eliminate the non-linearity of the energy distributor.

While the foregoing is directed to embodiments of the invention, other and further embodiments of the invention may be devised without departing from the basic scope thereof.

What is claimed is:

1. An apparatus for thermal processing of semiconductor substrates, comprising:
   a source of a rectangular laser light field, the source having a waveguide to confine laser light to an optical path;
   a rotatable polygonal mirror disposed in the optical path of the rectangular laser light field to generate a plurality of reflected laser pulses angularly distributed across a reflection field, each pulse having a rectangular shape; and
   a rectifier mounted to the waveguide, wherein the rectifier is disposed across the reflection field and above a work surface, the rectifier having one or more light-directing elements to direct the reflected laser pulses from the reflection field toward the work surface.

2. The apparatus of claim 1, wherein the rectifier is a linear member disposed along an axis perpendicular to the optical path of the laser light field incident on the polygonal mirror.

3. The apparatus of claim 2, wherein the rectifier comprises a plurality of optical elements.

4. The apparatus of claim 2, wherein the work surface comprises a conveyor movable in a direction substantially parallel to the optical path of the rectangular laser light field.

5. The apparatus of claim 3, wherein the rectifier comprises a plurality of mirrors.

6. The apparatus of claim 5, wherein the rectifier further comprises a plurality of lenses.

7. The apparatus of claim 6, wherein each of the plurality of lenses has an astigmatism.

8. The apparatus of claim 2, wherein the rectifier comprises a lens with a varying astigmatism.

9. The apparatus of claim 1, further comprising an f-theta lens disposed between the polygonal mirror and the rectifier.

10. An apparatus for thermally processing a substrate, comprising:
- a source of a rectangular field of thermal processing radiation, the source having a waveguide to confine thermal processing radiation to an optical axis;
- a rotatable polygonal mirror disposed along the optical axis of the rectangular field;
- a work surface capable of moving a substrate along a first axis; and
- a rectifier mounted to the waveguide, wherein the rectifier is in optical communication with the polygonal mirror and disposed adjacent to a work surface, the rectifier having one or more light-directing optical elements disposed toward the work surface.

11. The apparatus of claim 10, wherein the source of the rectangular field is a laser source.

12. The apparatus of claim 10, further comprising a light guide disposed opposite the work surface such that the rectifier and the polygonal mirror are between the work surface and the light guide.

13. The apparatus of claim 10, wherein the rectifier is a unitary linear optical element having an optical characteristic that varies along a major axis of the rectifier.

14. The apparatus of claim 10, further comprising a controller coupled to the source of the rectangular field of thermal processing radiation and to the polygonal mirror, and configured to control movement of the work surface and rotation rate of the polygonal mirror.

* * * * *

UNITED STATES PATENT AND TRADEMARK OFFICE
CERTIFICATE OF CORRECTION

PATENT NO. : 9,209,347 B2
APPLICATION NO. : 13/659656
DATED : December 8, 2015
INVENTOR(S) : Stephen Moffatt Page 1 of 1

It is certified that error appears in the above-identified patent and that said Letters Patent is hereby corrected as shown below:

In the specification:

Column 7, Line 16, please delete "6" and insert -- $\theta$ -- therefor.

Signed and Sealed this
Twenty-second Day of March, 2016

Michelle K. Lee
*Director of the United States Patent and Trademark Office*